(12) United States Patent
Chen

(10) Patent No.: US 6,358,798 B1
(45) Date of Patent: Mar. 19, 2002

(54) METHOD FOR FORMING GATE ELECTRODE BY DAMASCENE PROCESS

(75) Inventor: Chin-Yang Chen, Chi-Lung (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/655,678

(22) Filed: Sep. 6, 2000

(51) Int. Cl.[7] ............... H01L 21/336; H01L 21/8234; H01L 29/76; H01L 29/94; H01L 31/062

(52) U.S. Cl. ............ 438/259; 438/197; 257/330

(58) Field of Search .............. 438/633, 197, 438/259, 270, 337, 361, 524; 258/330

(56) References Cited

U.S. PATENT DOCUMENTS

| | | | |
|---|---|---|---|
| 6,054,355 A | * 4/2000 | Inumiya et al. | 438/296 |
| 6,060,358 A | * 5/2000 | Bracchiatta et al. | 438/259 |
| 6,090,672 A | * 7/2000 | Wanlass | 438/301 |
| 6,245,619 B1 | * 6/2001 | Boyd et al. | 438/289 |

* cited by examiner

Primary Examiner—Vu A. Le
Assistant Examiner—Adam Pyonin
(74) Attorney, Agent, or Firm—Powell, Goldstein, Frazer & Murphy LLP

(57) ABSTRACT

The present invention is a method for forming a gate electrode of a transistor in integrated circuits, where the gate electrode is formed by a damascene process. First, a substrate is provided with a gate dielectric layer thereon and a first gate layer is formed on the gate dielectric layer. Next, a first silicon oxide layer is deposited on the first gate layer and an opening through the first silicon oxide layer is formed by an etching process. Then, a first spacer is formed on sidewalls of the first silicon oxide layer in the opening and then the opening is filled with a second gate layer. Following, the first silicon oxide layer and the first spacer are removed to form a gate structure. Next, the first gate layer and the gate dielectric layer around the gate structure are removed. Then, a lightly doped drain, a second spacer, and a source/drain region are formed sequentially in the transistor.

15 Claims, 3 Drawing Sheets

METHOD FOR FORMING GATE ELECTRODE BY DAMASCENE PROCESS

BACKGROUND OF THE INVENTION

1. Field of the Invention

The present invention generally relates to a semiconductor manufacturing process, and more particularly to a method for forming a gate electrode by a damascene process.

2. Description of the Prior Art

In the integrated circuit (IC) industry, semiconductor devices are being manufactured to contain metal oxide semiconductor (MOS) transistors which having conductive gate electrodes usually formed from a damascene process or a non-damascene process.

In conventional non-damascene process, it is performing lithography process to form the gate electrode. However, the length of the gate electrode is limited by lithography capability. The gate etch process window is narrow because of the requirement of gate sidewall profile, gate residue free, and high etch selectivity to gate dielectric.

The conventional damascene process requires dummy gate removal steps. First, a gate electrode opening is formed first in a dielectric layer. After the opening is formed, the opening filled with a deposited conductive material where chemical mechanism polishing of the conductive material is used to confine the conductive material to the opening, and only the opening. Then, the dielectric layer is removed to form a gate structure. However, the length of the gate electrode is still limited by lithography capability. The silicon substrate is damaged and contaminated in dummy gate removal steps. Thus, it is a major concern to the quality of the dielectric. Another disadvantage is that the source/drain region is formed before gate dielectric growth, wherein the gate dielectric growth is in a high temperature, so the high temperature step enhances the short channel effect.

SUMMARY OF THE INVENTION

An object of the invention is to use a damascene process to control the gate length easily in a device.

It is another object of the invention that a thin gate layer is provided on the gate dielectric layer before performing the damascene process such that the substrate can be protected and residue can be reduced in dummy gate removal steps.

A further object of the invention is to prevent from short channel effect by forming the source/drain region after the gate dielectric growth.

In accordance with the present invention, a method for forming a transistor in integrated circuits, wherein the gate electrode of the transistor is formed by a damascene process, is provided. First, a substrate is provided with a gate dielectric layer thereon and a first gate layer is formed on the gate dielectric layer. Next, a first silicon oxide layer is deposited on the first gate layer and an opening through the first silicon oxide layer is formed by an etching process. Then, a first spacer is formed on sidewalls of the first silicon oxide layer in the opening and then the opening is filled with a second gate layer. Following, the first silicon oxide layer and the first spacer are removed to form a gate structure. The first gate layer and the gate dielectric layer around the gate structure are removed. Then, a lightly doped drain, a second spacer, and a source/drain region are formed sequentially in the transistor.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
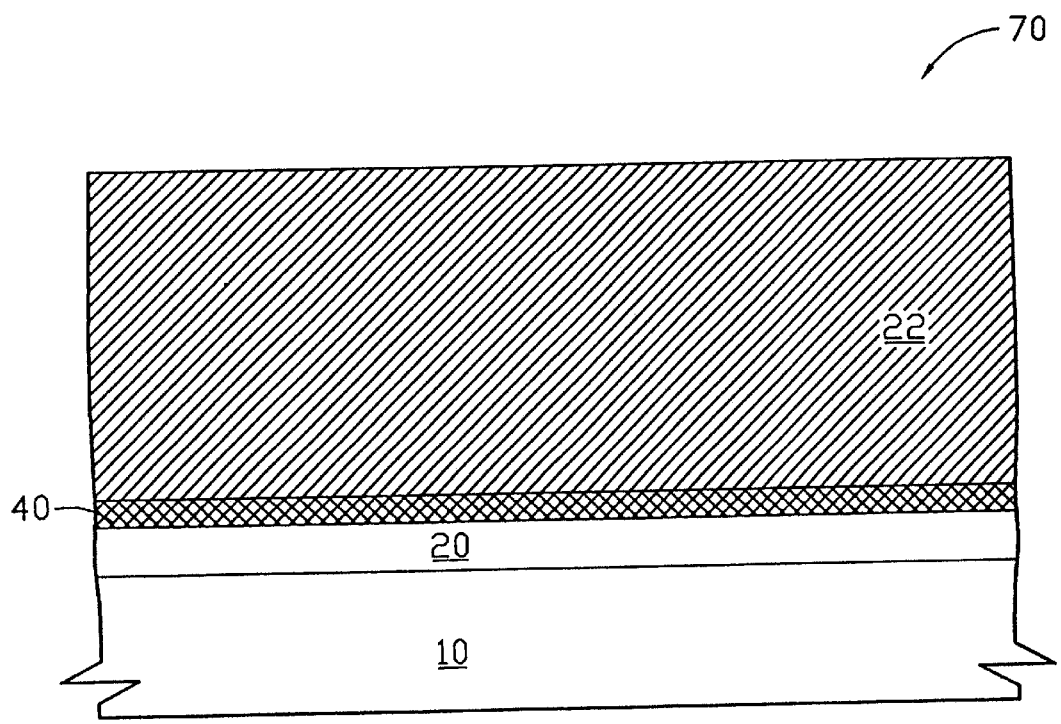
FIG. 1 shows a cross-sectional view of a substrate with a dielectric layer, a first gate layer, and a first silicon oxide layer formed thereon.

The semiconductor devices of the present invention are applicable to a broad range of semiconductor devices and can be fabricated from a variety of semiconductor materials. The following description discusses several presently preferred embodiments of the semiconductor devices of the present invention as implemented in silicon substrates, since the majority of currently available semiconductor devices are fabricated in silicon substrates and the most commonly encountered applications of the present invention will involve silicon substrates. Nevertheless, the present invention may also be advantageously employed in gallium arsenide, germanium, and other semiconductor materials. Accordingly, application of the present invention is not intended to be limited to those devices fabricated in silicon semiconductor materials, but will include those devices fabricated in one or more of the available semiconductor materials.

Further, while the present invention is illustrated by a number of preferred embodiments directed to silicon semiconductor devices, it is not intended that illustrations be a limitation on the scope or applicability of the present invention. Further, while the illustrative examples use insulated gate control structures, it should be recognized that the insulated gate portions may be replaced with light activated or current activated structure(s). Thus, it is not intended that the structures illustrated. These devices are included to demonstrate the utility and application of the present invention to presently preferred embodiments.

Moreover, various parts of the semiconductor elements have not been drawn to scale. Certain dimensions have exaggerated in relation to other dimensions in order to provide a clearer illustration and understanding of the present invention. For the purposes of illustration the preferred embodiment of the semiconductor devices of the present invention have been shown to include specific P and N type regions, but it should be clearly understood that the teachings herein are equally applicable to semiconductor devices in which the conductivities of the various regions have been reversed, for example, to provide the dual of the illustrated device. Enhancement and depletion mode structures may be similarly interchanged.

Moreover, although the embodiments illustrated herein are show in two-dimensional views with various regions having width and depth, it should be clearly understood that these regions are illustrations of only a portion of a single cell of a device, which may include a plurality of such cells arranged in a three-dimensional structure. Accordingly, these regions will have three dimensions, including length, width and depth, when fabricated in an actual device.

The present invention substantially provides a step of depositing a first gate layer on the gate dielectric layer before forming a gate electrode of a gate transistor by a damascene process. The first gate layer will become part of the gate electrode of the gate transistor. Suitable conditions for performing various steps set forth above and will be explained by reference to FIG. 1 to FIG. 6.

Referring to FIG. 1, a substrate 10 comprises sequentially a gate dielectric layer 20, a first gate layer 40 and a first silicon oxide layer 22 thereon. The gate dielectric layer 20 is made of the silicon oxide, and grown on the substrate 10 by thermal oxidation method. The gate dielectric layer 20 is in a thickness between about 100 to 900 angstroms. The first gate layer 40 is in a thickness between about 200 to 500 angstroms and formed by chemical vapor deposition method. The first gate layer 40 is made of the polysilicon. The first silicon oxide layer 22 is usually formed by chemical vapor deposition method. The first silicon oxide layer 22 is in a thickness depends on the depth of the desired gate electrode in a gate transistor 70.

Figure 2:
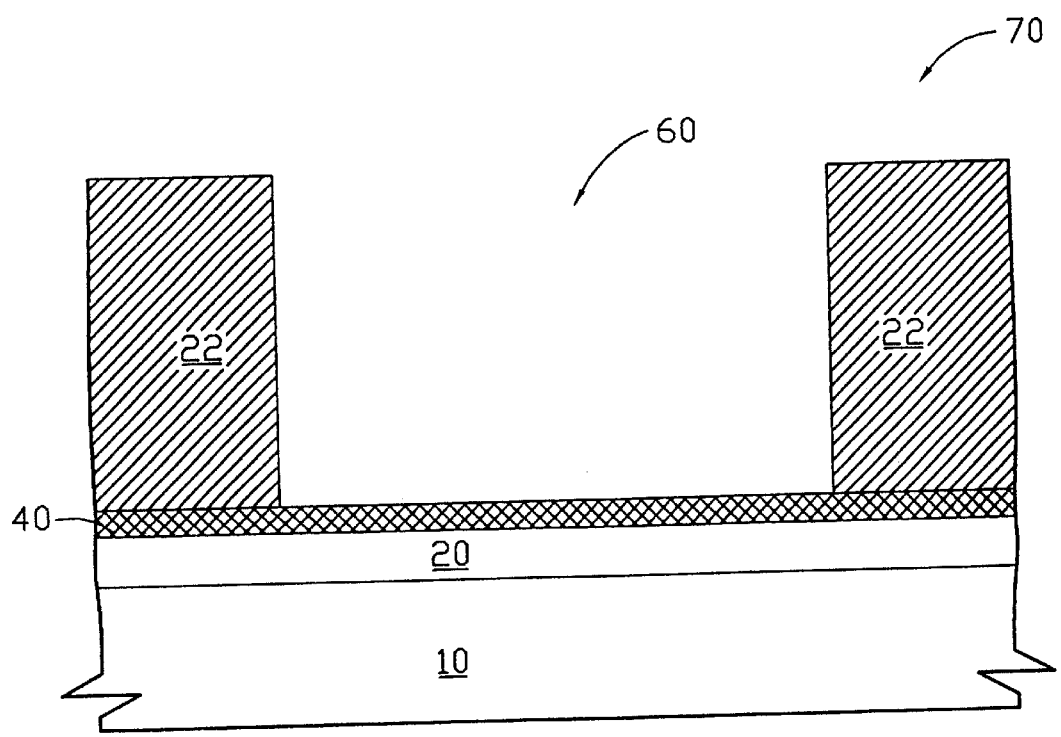
FIG. 2 shows the substrate of FIG. 1 after an opening within the first silicon oxide layer has been formed.

Referring to FIG. 2, an opening 60 through the first silicon oxide layer 22 is defined on the active region of the gate transistor 70. The opening 60 is formed by a lithography process to remove the first silicon oxide layer 22 and to expose a portion of the first gate layer 40. The area of the opening 60 equals about to an active region of the gate transistor 70.

Figure 3:
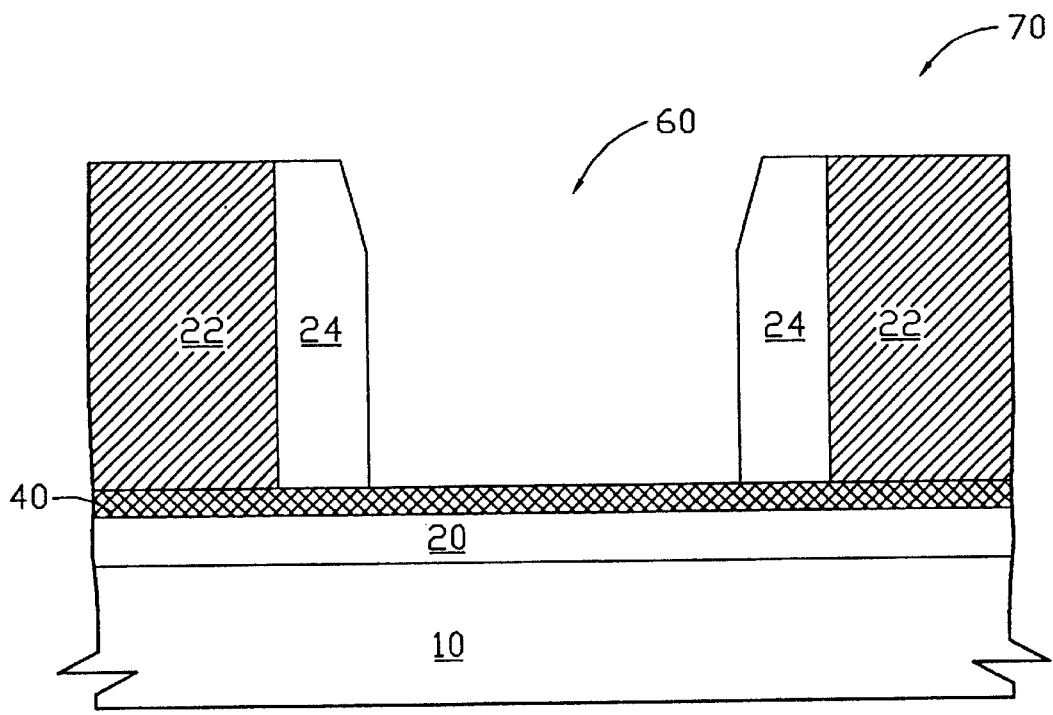
FIG. 3 shows the substrate of FIG. 2 after a first spacer has been formed in the opening.

Referring to FIG. 3, a first spacer 24 is formed on sidewalls of the first silicon oxide layer 22 in the opening 60. The first spacer 24 is made of the silicon oxide, and the manufacturing method is set forth below. First, a second silicon oxide layer 24 is formed on the substrate 10 and into the opening 60 by a chemical vapor depositing process. Then, the second silicon oxide layer 24 is anisotropically etched and stopped on the first gate layer 40 to form the first spacer 24 on sidewalls of the first silicon oxide layer 22 in the opening 60.

Figure 4:
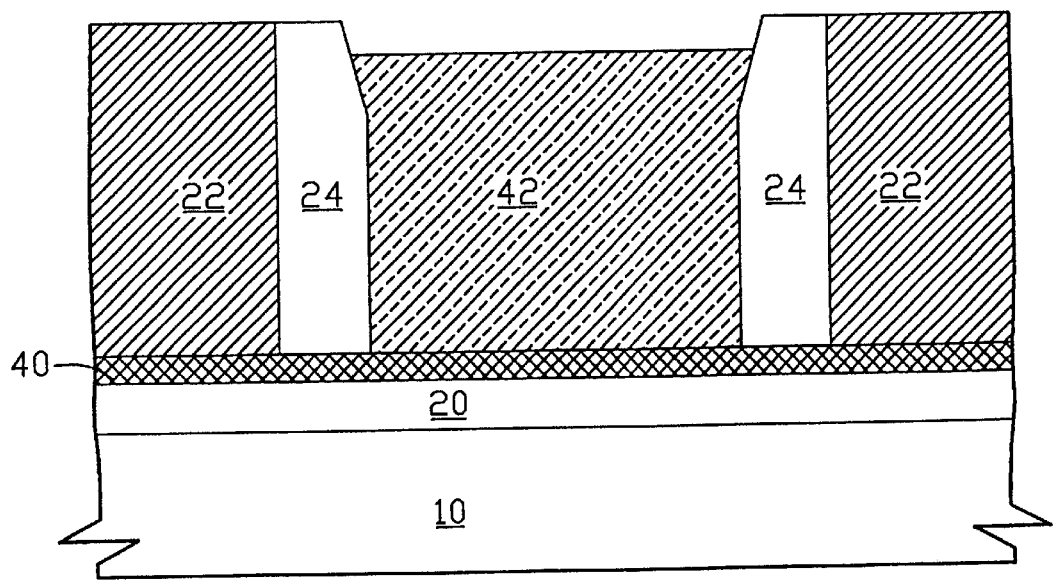
FIG. 4 shows the substrate of FIG. 3 after a second gate layer has been filled into the opening.

Referring to FIG. 4, the opening 60 is filled with a second gate layer 42 and the thickness of the second gate layer 42 is less than or equal to the depth of the opening 60. The second gate layer 42 is made of the polysilicon and formed by a chemical vapor deposition process on the substrate 10 and into the opening 60. Then, a chemical mechanism polishing process is performed to confine the second gate layer 42 to the opening 60, and only the opening 60. The thickness of the second gate layer 42 is less than or equal to the depth of the opening 60.

Figure 5:
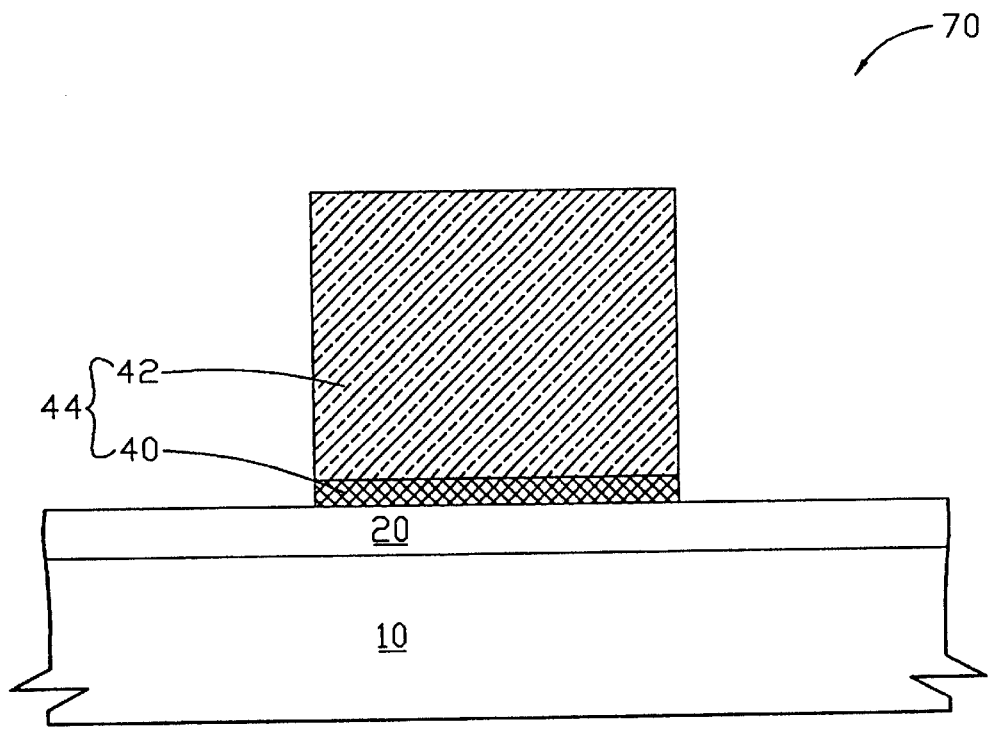
FIG. 5 shows the substrate of FIG. 4 after the first silicon oxide layer and the first spacer have been removed to form a gate structure.

Referring to FIG. 5, the first silicon oxide layer 22, the first spacer 24 and the first gate layer 40 are removed to form a gate structure 44 on the substrate 10. The first silicon oxide layer 20 and the first spacer 24 are removed by a wet etching process or a dry etching process. Then, the first gate layer 40 is removed by an anisotropically etching process without the mask on the second gate layer 42 because of the first gate layer 40 much thinner than the second gate layer 42.

Figure 6:
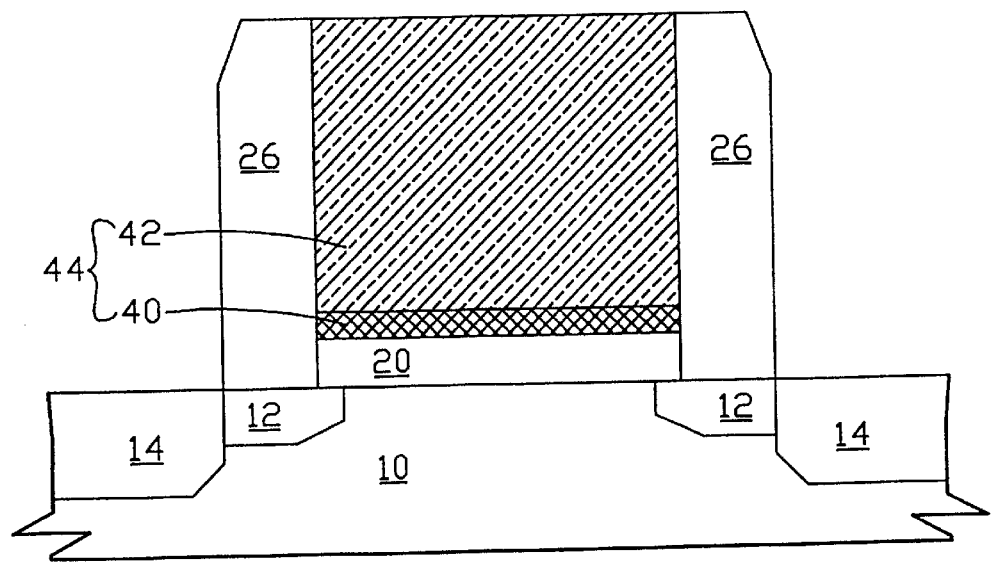
FIG. 6 shows the substrate of FIG. 5 after the gate dielectric layer has been removed and a lightly doped drain, a second spacer, and a source/drain region have been formed.

Referring to FIG. 6, after removing the gate dielectric layer 20 around the damascene gate structure 44, a lightly doped drain 12, a second spacer 26, and a source/drain region 14 are formed in the gate transistor. The gate dielectric layer 20 around the gate structure 44 is removed by a wet etching process or a dry etching process. The lightly doped drain 12 around the gate structure 44 is formed in the substrate 10 by an ion implanting process and then an annealing process. The first spacer 26 is made of the silicon oxide, and the manufacturing method is set forth below. First, a third silicon oxide layer 26 is formed on the substrate 10 and the gate structure 44 by a chemical vapor depositing process. Then, the third silicon oxide layer 26 is anisotropically etched and stopped on the substrate 10 to form the second spacer 26 on sidewalls of the gate structure 44. Following, a source/drain region 14 around the second spacer 26 is formed in the substrate 10 by an ion implanting process.

In the present invention, the gate length depends on the thickness of the first spacer formed in the gate electrode opening. If the thickness of the first spacer is raised and than the gate length can be lessened. However, the thickness of the first spacer depends on the depositing process and the depositing process is easily controlled. Another advantage of the present invention is that the first gate layer is provided on the gate dielectric layer before performing the damascene process, so the substrate is not damaged and not contaminated in dummy gate removal steps. Furthermore, the source/drain region is formed after the gate dielectric layer growth, wherein the gate dielectric growth is in a high temperature, so the high temperature step can not enhances the shot channel effect.

Of course, it is to be understood that the invention need not be limited to these disclosed embodiments. Various modification and similar changes are still possible within the spirit of this invention. In this way, the scope of this invention should be defined by the appended claims.

What is claimed is:

1. A method for forming a metal oxide semiconductor (MOS) transistor, said method comprising:

providing a substrate with a gate dielectric layer thereon;

forming a first gate layer on said gate dielectric layer;

depositing a first silicon oxide layer on said first gate layer;

etching said first silicon oxide layer to expose a portion of said first gate layer to form an opening;

forming a first spacer on sidewalls of said first silicon oxide layer in said opening;

filling said opening with a second gate layer;

removing said first silicon oxide layer and said first spacer to form a gate structure;

removing said first gate layer and said gate dielectric layer uncovered by said second gate layer; and sequentially forming a lightly doped drain (LDD), a second spacer, and a source/drain region in said metal oxide semiconductor transistor.

2. The method according to claim 1, wherein said gate dielectric layer is made of silicon oxide by using thermal oxidation method.

3. The method according to claim 1, wherein said first gate layer is made of polysilicon by a chemical vapor deposition process.

4. The method according to claim 1, wherein said first gate layer has a thickness of between about 200 to 500 angstroms.

5. The method according to claim 1, wherein said opening is on an active region of said metal oxide semiconductor transistor.

6. The method according to claim 1, wherein steps of forming said first spacer comprises:
   depositing a conformal second silicon oxide layer over said substrate; and
   blanket etching back said second silicon oxide layer to expose said first gate layer.

7. The method according to claim 1, wherein said second gate layer is made of polysilicon by a chemical vapor deposition process.

8. A method for forming a gate transistor, said method comprising:
   providing a substrate with a gate dielectric layer thereon, wherein said gate dielectric layer is made of silicon oxide by using thermal oxidation method;
   depositing a first gate layer on said gate dielectric layer, wherein said first gate layer is made of polysilicon by a chemical vapor deposition process;
   forming a first silicon oxide layer on said first gate layer;
   etching said first silicon oxide layer to expose a portion of said first gate layer to form an opening, wherein said opening is on an active region of said gate transistor;
   forming a first spacer on sidewalls of said first silicon oxide layer in said opening;
   filling said opening with a second gate layer, wherein said second gate layer is made of polysilicon by a chemical vapor deposition process;
   removing said first silicon oxide layer and said first spacer to form a gate structure;
   removing said first gate layer and said gate dielectric layer uncovered by said second gate layer; and
   sequentially forming a lightly doped drain (LDD), a second spacer, and a source/drain region in said gate transistor.

9. The method according to claim 8, wherein said first gate layer has a thickness of between about 200 to 500 angstroms.

10. The method according to claim 8, wherein steps of forming said first spacer comprises:
    depositing a conformal second silicon oxide layer over said substrate; and
    blanket etching back said second silicon oxide layer to expose said first gate layer.

11. A method for forming a gate electrode of metal oxide semiconductor transistor, said method comprising:
    providing a substrate with a gate dielectric layer thereon, wherein said gate dielectric layer is made of silicon oxide by using thermal oxidation method;
    forming a first gate layer on said gate dielectric layer;
    depositing a first silicon oxide layer on said first gate layer;
    etching said first silicon oxide layer to expose a portion of said first gate layer to form an opening;
    forming a first spacer on sidewalls of said first silicon oxide layer in said opening;
    filling said opening with a second gate layer;
    removing said first silicon oxide layer and said first spacer to form a gate structure.

12. The method according to claim 11, wherein said first gate layer is made of polysilicon by a chemical vapor deposition process.

13. The method according to claim 11, wherein said first gate layer is in a thickness of between about 200 to 500 angstroms.

14. The method according to claim 11, wherein steps of forming said first spacer comprises:
    depositing a conformal second silicon oxide layer over said substrate; and
    blanket etching back said second silicon oxide layer to expose said first gate layer.

15. The method according to claim 11, wherein said second gate layer is made of polysilicon by a chemical vapor deposition process.

* * * * *